(12) United States Patent
Boca et al.

(10) Patent No.: US 11,081,609 B2
(45) Date of Patent: Aug. 3, 2021

(54) SOLAR CELL STRUCTURE AND COMPOSITION AND METHOD FOR FORMING THE SAME

(71) Applicant: The Boeing Company, Chicago, IL (US)

(72) Inventors: Andreea Boca, Sherman Oaks, CA (US); Daniel C. Law, Arcadia, CA (US); Joseph Charles Boisvert, Thousand Oaks, CA (US); Nasser H. Karam, La Canada, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 14/628,923

(22) Filed: Feb. 23, 2015

(65) Prior Publication Data
US 2015/0171253 A1    Jun. 18, 2015

Related U.S. Application Data

(62) Division of application No. 12/814,722, filed on Jun. 14, 2010, now Pat. No. 8,993,879.

(51) Int. Cl.
*H01L 31/0687*    (2012.01)
*H01L 31/0693*    (2012.01)
(Continued)

(52) U.S. Cl.
CPC ...... *H01L 31/0687* (2013.01); *H01L 21/2007* (2013.01); *H01L 31/043* (2014.12); *H01L 31/0693* (2013.01); *H01L 31/06875* (2013.01); *H01L 31/0725* (2013.01); *H01L 31/1844* (2013.01); *H01L 31/1892* (2013.01);
(Continued)

(58) Field of Classification Search
CPC .............. H01L 31/043; H01L 31/0687; H01L 31/06875; H01L 31/1896; H01L 21/2007; H01L 31/0693; H01L 31/1844; H01L 31/0725; H01L 31/1892; H01L 31/18; Y02E 10/544; Y02E 10/547
See application file for complete search history.

(56) References Cited

U.S. PATENT DOCUMENTS

| | | | |
|---|---|---|---|
| 5,328,549 A | 7/1994 | Bozler et al. | |
| 2002/0085968 A1* | 7/2002 | Smalley | B01J 19/081 428/367 |

(Continued)

FOREIGN PATENT DOCUMENTS

| | | |
|---|---|---|
| DE | 102008021706 | 11/2009 |
| JP | 2004-319934 | 11/2004 |

(Continued)

OTHER PUBLICATIONS

Zahler et al. "Wafer Bonding and Layer Transfer Processes for High Efficiency Solar Cells" NCPV and Solar Program Review Meeting 2003, NREL/CD-520-33586 pp. 723-725 (Year: 2003).*

(Continued)

*Primary Examiner* — Magali P Slawski
(74) *Attorney, Agent, or Firm* — Vivacqua Crane

(57) ABSTRACT

A semiconductor structure including a bonding layer connecting a first semiconductor wafer layer to a second semiconductor wafer layer, the bonding layer including an electrically conductive carbonaceous component and a binder component.

20 Claims, 5 Drawing Sheets

(51) Int. Cl.
    *H01L 31/043*     (2014.01)
    *H01L 31/0725*    (2012.01)
    *H01L 31/18*      (2006.01)
    *H01L 21/20*      (2006.01)

(52) U.S. Cl.
    CPC .......... *H01L 31/1896* (2013.01); *H01L 31/18* (2013.01); *Y02E 10/544* (2013.01)

(56) References Cited

U.S. PATENT DOCUMENTS

| | | | |
|---|---|---|---|
| 2004/0206389 | A1 | 10/2004 | Takamoto et al. |
| 2007/0246094 | A1* | 10/2007 | Brabec .................. H01L 27/302 136/244 |
| 2008/0009123 | A1 | 1/2008 | Kostrzewa et al. |
| 2008/0089829 | A1* | 4/2008 | Ganapathiraman .... B82Y 10/00 423/447.3 |
| 2009/0001326 | A1* | 1/2009 | Sato ........................ B82Y 30/00 252/511 |
| 2009/0061194 | A1* | 3/2009 | Green .................... B82Y 10/00 428/220 |
| 2009/0114273 | A1 | 5/2009 | Kamat |
| 2009/0211633 | A1* | 8/2009 | Schilinsky ............ H01L 27/302 136/256 |
| 2010/0083999 | A1* | 4/2010 | Hovel .................... B82Y 20/00 136/244 |
| 2010/0136224 | A1* | 6/2010 | Britz ........................ H01B 1/24 427/122 |
| 2011/0014455 | A1* | 1/2011 | Miller .................... B82Y 30/00 428/331 |
| 2011/0043097 | A1* | 2/2011 | Cheng .................... H01J 63/02 313/496 |

FOREIGN PATENT DOCUMENTS

| | | |
|---|---|---|
| JP | 2010-109226 | 5/2010 |
| WO | 2009/137141 | 11/2009 |

OTHER PUBLICATIONS

JP, Decision of Rejection (with English translation); Japanese Patent Application No. 2013-515335 (dated Dec. 8, 2015).
JP, Notice of Reasons for Rejection (English translation); Japanese Patent Application No. 2013-515335 (dated May 19, 2015).
PCT, International Search Report and Written Opinion, PCT/US2011/034255 (dated Jun. 15, 2012).
Barnes, T. et al., "Single-wall carbon nanotube networks as a transparent back contact in CdTe solar cells," Applied Physics Letters, AIP, American Institute of Physics, Melville, NY, US, vol. 90, No. 24, pp. 243503 through 243503-3 (Jun. 11, 2007).
Boca, A. et al., "Carbon nanotube-composite wafer bonding for ultra-high efficiency III-V multijunction solar cells," Proceedings of the 35th IEEE Photovoltaic Specialists Conference, pp. 003310-003315 (Jun. 20, 2010).
Law, D.C. et al., "Future technology pathways of terrestrial III-V multijunction solar cells for concentrator photovoltaic systems," Solar Energy Materials and Solar Cells, Elsevier Science Publishers, Amsterdam, NL, vol. 94, No. 8, pp. 1314-1318 (2010).
Niklaus, F. et al., "Adhesive wafer bonding," Journal of Applied Physics, American Institute of Physics, NY, US, vol. 99, pp. 031101-1 through 031101-28 (Jan. 1, 2006).
US Pharmacopeia (www.pharmacopeia.cn/v29240/usp29nf24s0_alpha-2-31.html) accessed Mar. 12, 2014.
Binkley, Meisha A.; Non-Final Office Action; U.S. Appl. No. 12/814,722 (dated Feb. 14, 2013).
Binkley, Meisha A.; Final Office Action; U.S. Appl. No. 12/814,722 (dated Sep. 6, 2013).
Binkley, Meisha A.; Non-Final Office Action; U.S. Appl. No. 12/814,722 (dated Mar. 20, 2014).
Binkley, Meisha A.; Notice of Allowance; U.S. Appl. No. 12/814,722 (dated Nov. 25, 2014).
JP, Notice of Reasons for Rejection (with English translation); Japanese Patent Application No. 2016-076946, 4 pages (dated May 23, 2017).
Kuwahara et al., Effects of Tube Diameter and Length on Transparent Conductivity of Single-Walled Carbon Nanotube Network Films, Oct. 25, 2018, 9 pages, Hindawi, Journal of Nanomaterials.

\* cited by examiner

SOLAR CELL STRUCTURE AND COMPOSITION AND METHOD FOR FORMING THE SAME

PRIOR APPLICATION

This is a divisional application of U.S. patent application Ser. No. 12/814,722 filed Jun. 14, 2010.

GOVERNMENT CONTRACT

This invention was made with Government support under NR0000-08-C-0159 awarded by the National Reconnaissance Office. The Government of the United States may have certain rights in the invention.

FIELD

This application relates to wafer bonding, particularly in solar cells. More particularly, this application relates to compositions and methods for bonding solar subcells to form high-efficiency, multi junction solar cell structures.

BACKGROUND

Conventionally, high-efficiency III-V multi junction solar cells are formed by growing all of the component subcells lattice-matched to a single substrate. Unfortunately, this approach limits material choices and, hence, the band gaps available for solar cell design, thereby resulting in suboptimal power conversion efficiencies.

In an alternative approach, each component subcell of a solar cell structure is grown on the most suitable substrate. Then, the subcells are integrated into a multi junction solar cell structure using wafer bonding techniques.

One known wafer bonding technique employs transparent metal oxides as a bonding agent. For example, indium tin oxide has been shown to have acceptable optical transparency, as well as good electrical conductivity. However, indium tin oxide has presented difficulties in achieving high quality bonds over a large surface area.

Other known wafer bonding techniques include using thin metallic interface layers or direct semiconductor-to-semiconductor bonding through heavily-doped, thick III-V interface layers.

Nonetheless, those skilled in the art continue to seek new wafer bonding techniques, including wafer bonding techniques that may be used in the construction of high-efficiency solar cells.

SUMMARY

In one aspect, the disclosed semiconductor device structure may include a bonding layer connecting a first semiconductor wafer layer to a second semiconductor wafer layer, the bonding layer including an electrically conductive carbonaceous component and a binder/adhesive component.

In another aspect, the disclosed solar cell structure may include at least one top subcell connected to at least one bottom subcell by a bonding layer, the bonding layer including carbon nanotubes and a binder/adhesive component.

In yet another aspect, disclosed is a method for assembling a solar cell structure. The method may include the steps of (1) growing or depositing at least one bottom subcell on a bottom substrate, (2) growing or depositing a least one top subcell on a top substrate, (3) applying a bonding layer to the bottom subcell and/or the top subcell, the bonding layer including an electrically conductive component and a binder/adhesive component, (4) connecting the top subcell to the bottom subcell such that the bonding layer is disposed therebetween and (5) if necessary (e.g., for optical transparency or electrical conductivity) removing the top substrate from the top subcell(s).

Other aspects of the disclosed solar cell structure and composition and method for forming the same will become apparent from the following description, the accompanying drawings and the appended claims.

DETAILED DESCRIPTION

Figure 1:
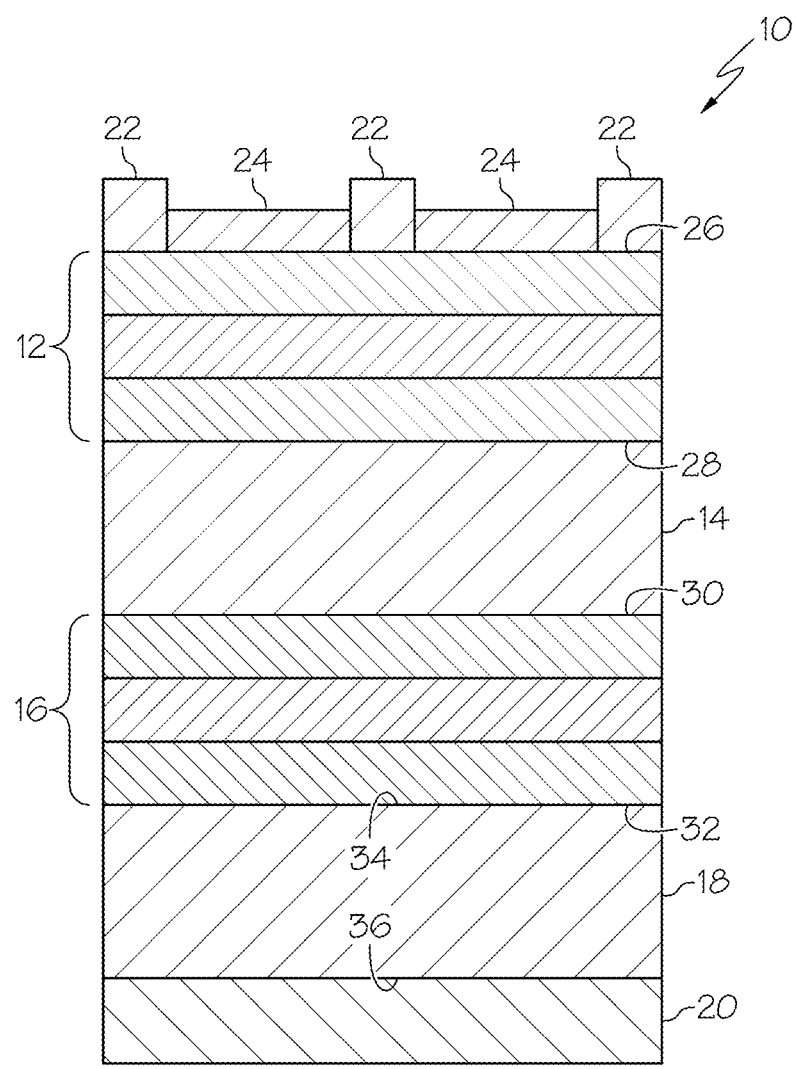
FIG. 1 is a schematic side elevational view of a solar cell structure assembled in accordance with one aspect of the disclosure.

Referring to FIG. 1, one aspect of the disclosed solar cell structure, generally designated 10, may include at least one top subcell 12, a bonding layer 14, at least one bottom subcell 16 and a bottom substrate 18. The solar cell structure 10 may additionally include a bottom contact layer 20, a top contact layer (e.g., contacts 22) and an anti-reflective coating layer 24. Other components may also be included in the solar cell structure 10 without departing from the scope of the present disclosure.

The at least one top subcell 12 may include a layer (or multiple layers) of semiconductor material having a front surface 26 and a back surface 28. The top contacts 22 and the anti-reflective coating layer 24 may be positioned adjacent to the front surface 26 of the at least one top subcell 12. The back surface 28 of the at least one top subcell 12 may be adjacent to the bonding layer 14.

The at least one bottom subcell 16 may include a layer (or multiple layers) of semiconductor material having a front surface 30 and a back surface 32. The front surface 30 of the at least one bottom subcell 16 may be adjacent to the bonding layer 14. The bottom substrate 18 may be positioned adjacent to back surface 32 of the at least one bottom subcell 16.

The bottom substrate 18 may include a front surface 34 and a back surface 36. The at least one bottom subcell 16 may be positioned adjacent to the front surface 34 of the bottom substrate 18 and the bottom contact layer 20 may be positioned adjacent to the back surface 36 of the bottom substrate 18.

The bonding layer 14 may include an electrically conductive component and a binder component. The electrically conductive component of the bonding layer 14 may provide vertical electrical conductivity between the at least one top subcell 12 and the at least one bottom subcell 16. The binder component of the bonding layer 14 may bond the at least one top subcell 12 to the at least one bottom subcell 16.

The composition of the bonding layer 14 may be selected to provide sufficient optical transparency, vertical electrical conductivity and sufficient bond strength. For example, for a five junction solar cell design, the composition of the bonding layer 14 may be selected to provide (1) optical transmission greater than 95 percent over the optical wavelengths in the spectral range relevant to the at least one bottom subcell 16 (e.g., wavelength greater than 800 nanometers); (2) total electrical resistance of at most 1 Ohm-cm$^2$ (note: this total resistance includes the contact resistance to the semiconductor layers adjacent to the bonding layer 14, as well as the vertical resistance of the bonding layer 14 itself); and (3) bond strength having sufficient robustness to withstand the processing steps as well as the end-use operating conditions (e.g., terrestrial or space conditions).

The electrically conductive component of the bonding layer 14 may be selected to provide the bonding layer 14 with the required electrical conductivity without substantially reducing the optical transparency of the bonding layer 14. Therefore, the amount of the electrically conductive component in the bonding layer 14 may be dictated by the composition of the electrically conductive component.

In a first expression, the electrically conductive component of the bonding layer 14 may include an electrically conductive carbonaceous material or a combination of electrically conductive carbonaceous materials. In a second expression, the electrically conductive component of the bonding layer 14 may include a combination of electrically conductive carbonaceous material and inorganic conductive material.

In a first implementation of the first expression, the electrically conductive carbonaceous material may include carbon nanotubes. For example, the carbon nanotubes may be single-walled nanotubes having an average diameter of about 1 to 2 nanometers and a length of at least 1 micron. The carbon nanotubes may be in bundles and may define void space (e.g., 50 percent void space) between the nanotubes that may receive the binder component. Suitable carbon nanotube films infiltrated with binders (described in greater detail below) are marketed under the INVISICON® brand by Eikos, Inc. of Franklin, Mass.

The binder component of the bonding layer 14 may be selected to provide the bonding layer 14 with robust bonding capability without substantially reducing the optical transparency of the bonding layer 14. Therefore, the amount of the electrically conductive component in the bonding layer 14 may be dictated by the composition of the binder component.

In one particular expression, the binder component of the bonding layer 14 may be or may include a metal oxide, a metal nitride, a polymer, an inorganic-organic hybrid or combinations thereof. Examples of suitable binder components include $Al_2O_3$ (alumina), $TiO_2$ (titania), $HfO_2$ (hafnia), $SiO_2$ (silica), $Si_4N_3$ (silicon nitride), ZnO (zinc oxide) and $In_2O_3/SnO_2$ (indium tin oxide). Examples of other suitable binder components include silicones, such as Dow-Corning 93-500, and polymers, such as PDMS (polydimethylsiloxane).

As noted above, the electrically conductive component of the bonding layer 14 may include carbon nanotubes that define voids and that render the bonding layer 14 electrically conductive. The binder component of the bonding layer 14 may infiltrate the voids defined by the electrically conductive component to form a film. The binder component may provide the film with robustness and optical tunability.

The bonding layer 14 may be formed using various techniques, as is described below. The resulting thickness of the bonding layer 14 may range, for example, from about 10 nanometers to about 100 nanometers.

Figure 2A:
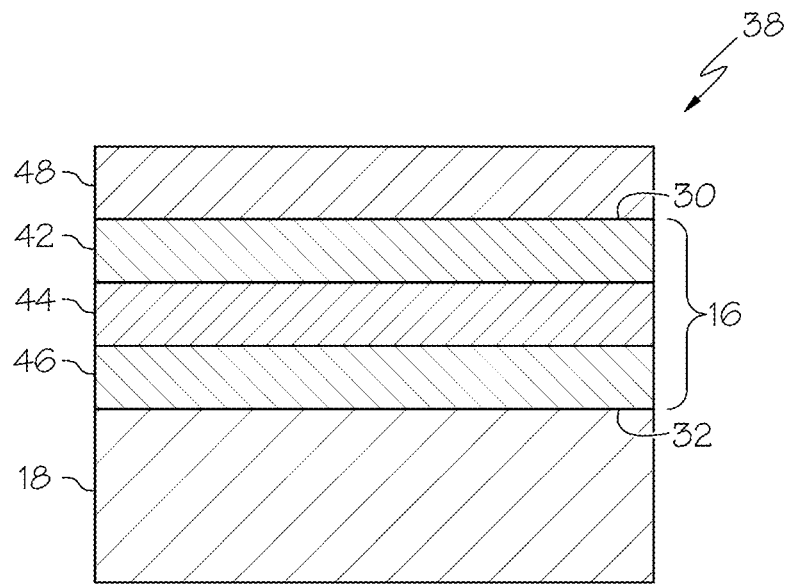
FIG. 2A is a schematic side elevational view of a bottom subcell assembly used to form the solar cell structure of FIG. 1.
Figure 2B:
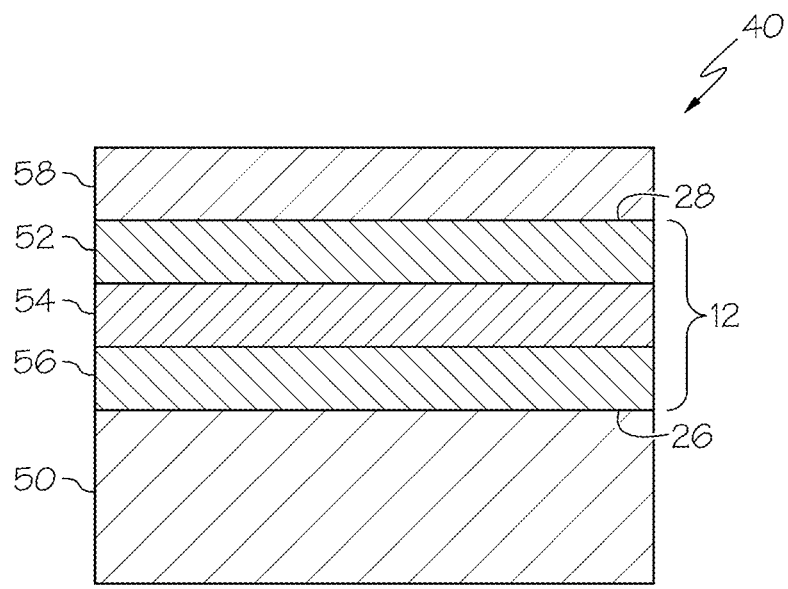
FIG. 2B is a schematic side elevational view of a top subcell assembly used to assemble the solar cell structure of FIG. 1.
Figure 5:
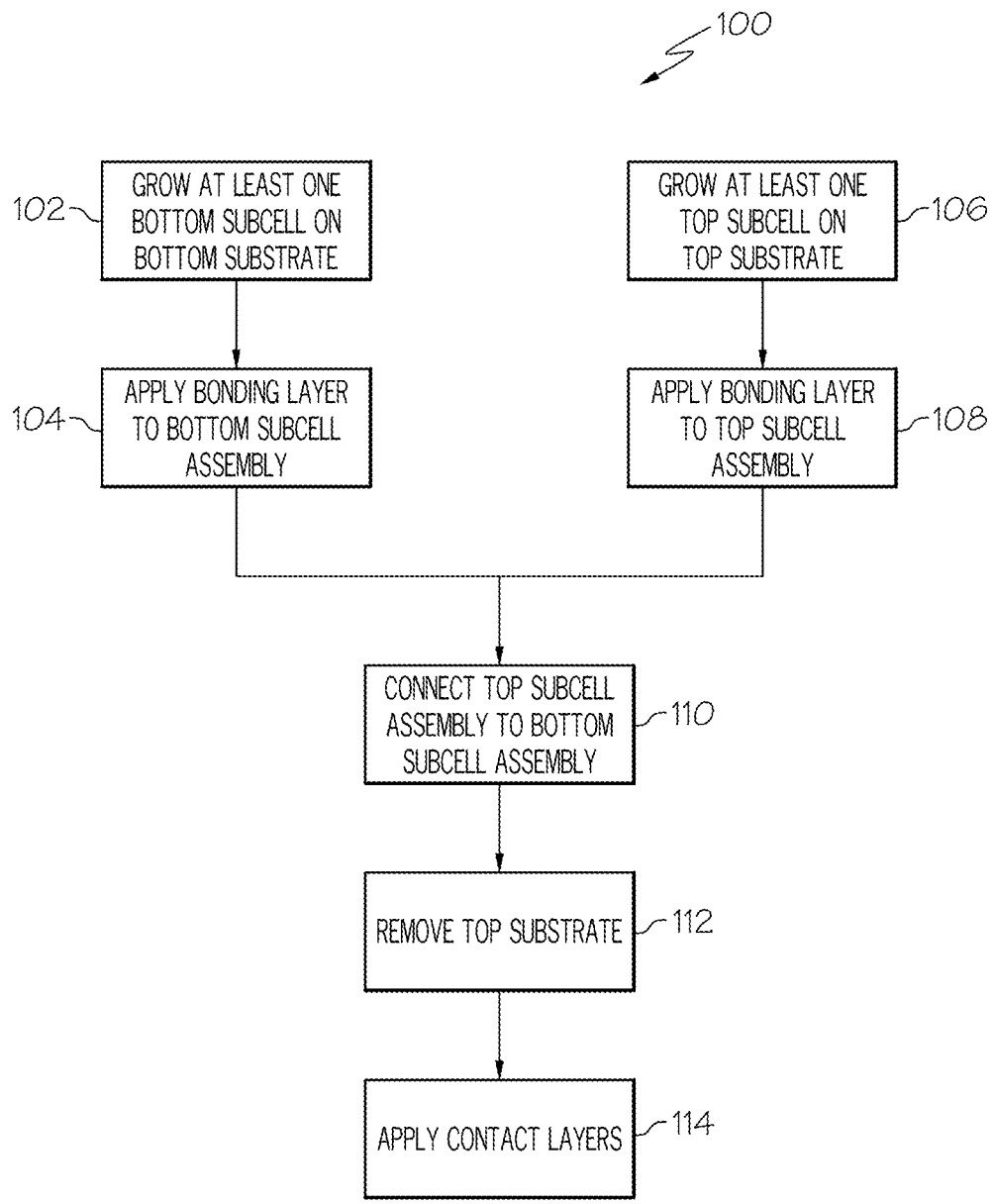
FIG. 5 is a flow chart illustrating an aspect of the disclosed method for manufacturing a solar cell structure.

Also disclosed is a method for manufacturing a semiconductor structure, such as the solar cell structure 10 shown in FIG. 1. Referring to FIG. 5, one aspect of the disclosed method, generally designated 100, may begin with the formation of a bottom subcell assembly 38 (FIG. 2A) at blocks 102 and 104 and the formation of a top subcell assembly 40 (FIG. 2B) at blocks 106 and 108.

Referring to block 102 in FIG. 5, formation of the bottom subcell assembly 38 (FIG. 2A) may begin by forming the at least one bottom subcell 16 on the bottom substrate 18. For example, the at least one bottom subcell 16 may be formed by epitaxially growing the at least one bottom subcell 16 on the bottom substrate 18. The at least one bottom subcell 16 may be grown upright and lattice-matched (or nearly lattice-matched) to the bottom substrate 18. For example, the bottom substrate 18 may be an InP substrate and the at least one bottom subcell 16 may include a GaInPAs subcell 42 and a GaInAs subcell 44.

Referring to block 104 in FIG. 5, a first bonding layer 48 may be applied to the front surface 30 of the at least one bottom subcell 16. Those skilled in the art will appreciate that various techniques may be used to apply the disclosed bonding composition to form the first bonding layer 48. In one implementation, the bonding layer 48 may be formed by applying a bonding composition formulated as a blend that includes the electrically conductive component and the binder component. In another implementation, the bonding layer 48 may be formed by first applying the electrically conductive component and then, separately, applying the binder component.

As one specific example, the bonding layer 48 may be formed in two steps: (1) forming a carbon nanotube film and (2) infiltrating the carbon nanotube film with a binder. An optional curing step may also be used. The carbon nanotube film may be formed by printing or spray-coating a carbon nanotube ink onto the front surface 30 of the at least one bottom subcell 16. The carbon nanotube ink may be prepared as a dispersion of purified carbon nanotubes in a carrier, such as an aqueous carrier (e.g., water). The printing or spray-coating step may be performed at low ambient temperatures to minimize premature evaporation of the carrier.

Once the carbon nanotube ink has dried, the remaining carbon nanotubes on the front surface 30 may be infiltrated with the binder. For example, the binder may be prepared as a liquid solution, such as a solution or sol-gel of binder. As a specific example, the binder solution may include $SiO_2$ dissolved in alcohol. Then, the carbon nanotube film may be dip coated using the binder solution to infiltrate the carbon nanotube film with the binder component, thereby forming a bonding layer 48 that includes an electrically conductive component and a binder component.

Referring to block 106 in FIG. 5, formation of the top subcell assembly 40 (FIG. 2B) may begin by forming the at least one top subcell 12 on the top substrate 50. For example, the at least one top subcell 12 may be formed by epitaxially growing the at least one top subcell 12 on the top substrate 50. The at least one top subcell 12 may be grown inverted and lattice-matched (or nearly lattice-matched) to the top substrate 50. For example, the top substrate 50 may be a GaAs substrate and the at least one top subcell 12 may include a GaAs subcell 52, a AlGaInAs subcell 54 and a GaInP subcell 56.

Referring to block 108 in FIG. 5, a second bonding layer 58 may be applied to the back surface 28 of the at least one top subcell 12. The second bonding layer 58 may be applied using various techniques, as described above.

At this point, those skilled in the art will appreciate that both subcell assemblies 38, 40 do not need a bonding layer 48, 58. Rather, in an alternative aspect, only one of the bottom 38 and top 40 subcell assemblies may be provided with a bonding layer 48, 58.

Figure 3:
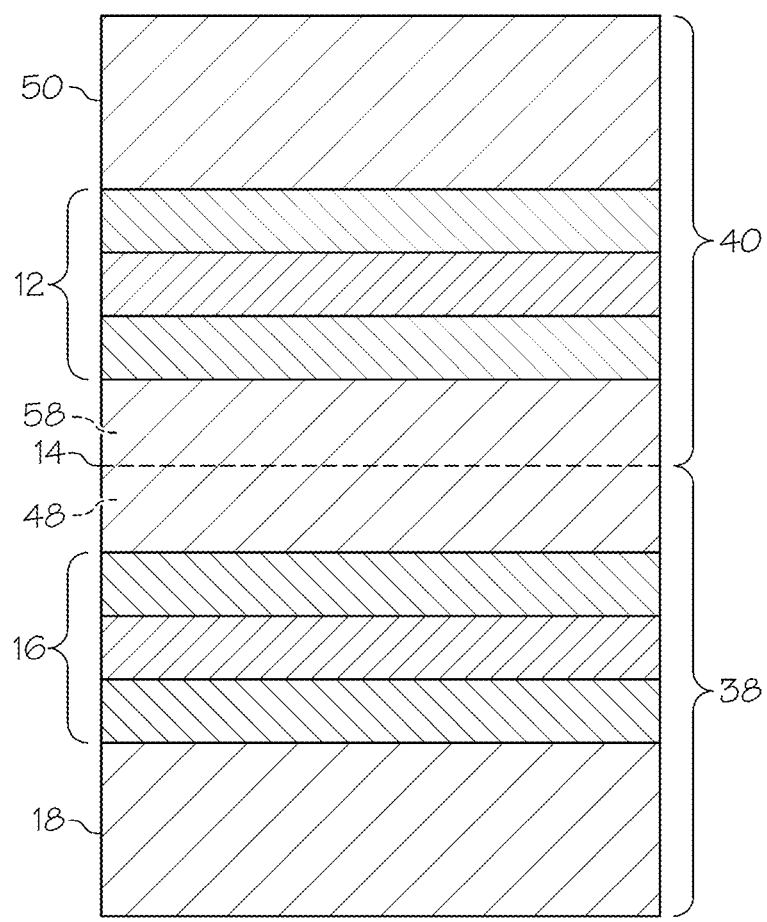
FIG. 3 is a schematic side elevational view of a solar cell pre-assembly formed by bonding the top subcell assembly of FIG. 2B to the bottom subcell assembly of FIG. 2A.
Figure 4:
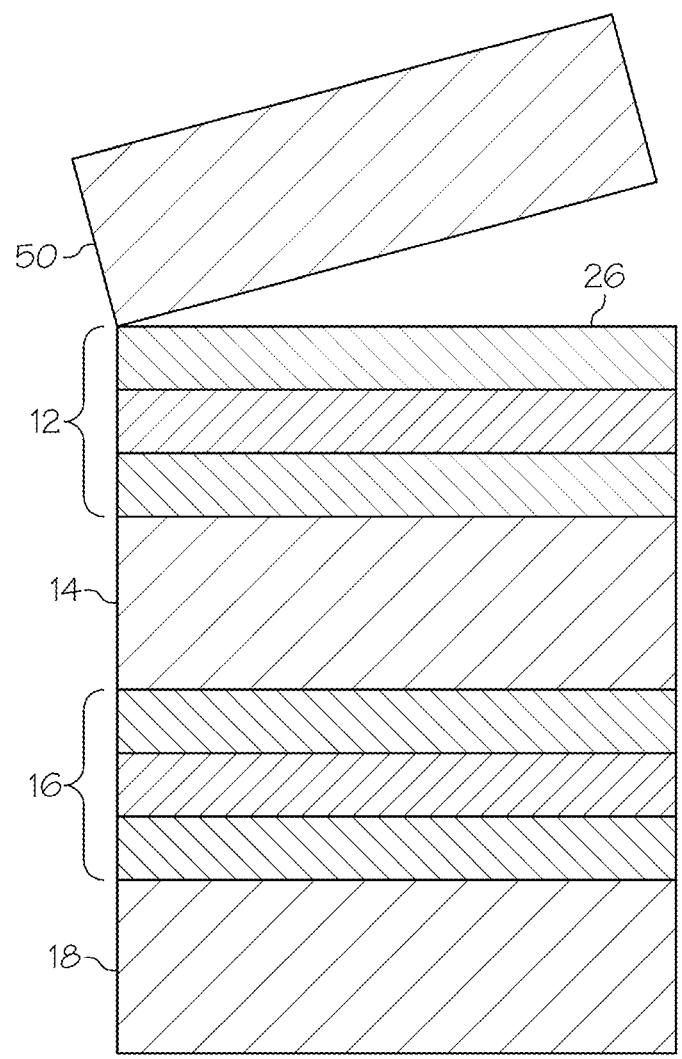
FIG. 4 is a schematic side elevational view of the solar cell pre-assembly of FIG. 3 shown with the second substrate removed therefrom.

Referring to block 110 in FIG. 5, the top subcell assembly 40 may be connected to the bottom subcell assembly 38 by mating the first bonding layer 48 with the second bonding layer 58 to form the bonding layer 14, as shown in FIG. 3. The bonding layer 14 may be cured as necessary. At block 112 (FIG. 5), the top substrate 50 may be removed if necessary (e.g., if not optically transparent or electrically conductive), as shown in FIG. 4, thereby exposing the front surface 26 of the at least one top subcell 12. Finally, at block 114 (FIG. 5), the top contacts 22 may be applied to the front surface 26 of the at least one top subcell 12 and the bottom contact 20 may be applied to the back surface 36 of the bottom substrate 18, as shown in FIG. 1.

Accordingly, the disclosed bonding composition may be used to bond a first semiconductor wafer to a second semiconductor wafer. In particular, the optical, electrical conductivity and bonding properties of the disclosed bonding composition facilitate use of the composition to bond a top subcell stack to a bottom subcell stack to form a solar cell structure. As such, the top subcell stack may be grown lattice-matched or nearly lattice-matched (i.e., substantially lattice-matched) to the top substrate and the bottom subcell stack may be grown lattice-matched or nearly lattice-matched (i.e., substantially lattice-matched) to the bottom (different type) substrate, and the disclosed bonding composition may be used to physically and electrically connect the top subcell stack to the bottom subcell stack with minimal optical degradation, particularly when carbon nanotubes are used as the electrically conductive component of the bonding composition.

Although various aspects of the disclosed solar cell structure and composition and method for forming the same have been shown and described, modifications may occur to those skilled in the art upon reading the specification. The present application includes such modifications and is limited only by the scope of the claims.

What is claimed is:

1. A semiconductor structure comprising:
    a first semiconductor wafer layer including at least one top subcell, wherein said at least one top subcell includes one or more of the following: a gallium arsenide (GaAs) subcell, an aluminum gallium indium arsenic (AlGaInAs) subcell, and a gallium indium phosphide (GaInP) subcell;
    a second semiconductor wafer including a bottom substrate and at least one bottom subcell, wherein said at least one bottom subcell has been epitaxially grown from said bottom substrate, and wherein said at least one bottom subcell includes at least one of said following: gallium indium phosphide arsenic (GaInPAs) subcell and a gallium indium arsenic (GaInAs) subcell; and
    a bonding layer connecting said first semiconductor wafer layer to said second semiconductor wafer layer, said bonding layer comprising an electrically conductive carbonaceous component and a binder component that provides bonding capability to connect said first semiconductor wafer layer to said second semiconductor wafer layer, said electrically conductive carbonaceous component comprising single-walled carbon nanotubes having a length of at least one micron, wherein said carbon nanotubes are in bundles that define void spaces between said carbon nanotubes, said carbon nanotubes rendering said bonding layer electrically conductive and said binder component of said bonding layer infiltrating said void spaces defined by said carbon nanotubes to form a film.

2. The semiconductor structure of claim 1 wherein said bonding layer has an optical transmission of at least 85 percent at a wavelength of at least 800 nanometers.

3. The semiconductor structure of claim 1 wherein said carbon nanotubes have an average cross-sectional thickness in a range from about 1 to about 2 nanometers.

4. The semiconductor structure of claim 1 wherein said binder component comprises at least one of a metal oxide, a metal nitride, a semiconductor oxide, a semiconductor nitride, a polymer and a silicone.

5. The semiconductor structure of claim 1 wherein said binder component is selected from the group consisting of alumina, titania, hafnia, silica, silicon nitride, zinc oxide, indium tin oxide and combinations thereof.

6. The semiconductor structure of claim 1 wherein said bonding layer has a thickness in a range from about 10 nanometers to about 100 nanometers.

7. The semiconductor structure of claim 1 wherein said bonding layer has an optical transmission of at least 95 percent at a wavelength of at least 800 nanometers.

8. The semiconductor structure of claim 1 wherein said second semiconductor wafer layer absorbs light in a spectral range, and wherein said bonding layer has an optical transmission of at least 85 percent throughout said spectral range.

9. The semiconductor structure of claim 1 wherein said bonding layer has a total electrical resistance of at most 1 Ohm-cm$^2$.

10. A solar cell structure comprising:
    a first semiconductor wafer layer including a top substrate and at least one top subcell, wherein said at least at least one top subcell has been epitaxially grown from said top substrate, and wherein said at least one top subcell includes one or more of the following: a gallium arsenide (GaAs) subcell, an aluminum gallium indium arsenic (AlGaInAs) subcell, and a gallium indium phosphide (GaInP) subcell;
    a second semiconductor wafer including a bottom substrate and at least one bottom subcell, wherein said at least at least one bottom subcell has been epitaxially grown from said bottom substrate, and wherein said at least one bottom subcell includes at least one of said following: gallium indium phosphide arsenic (GaInPAs) subcell and a gallium indium arsenic (GaInAs) subcell; and
    a bonding layer connecting said first semiconductor wafer layer to said second semiconductor wafer layer, said bonding layer comprising single-walled carbon nanotubes having a length of at least one micron and a binder component, wherein said bottom subcell operates in a spectral range, and wherein said bonding layer has an optical transmission of at least 85 percent throughout said spectral range, and wherein said binder component provides bonding capability to connect said first semiconductor wafer layer to said second semiconductor wafer layer, and the carbon nanotubes are in bundles that define void spaces between said carbon nanotubes, said carbon nanotubes rendering said bonding layer electrically conductive and said binder component of said bonding layer infiltrating said void spaces defined by said carbon nanotubes to form a film.

11. The solar cell structure of claim 10 wherein said carbon nanotubes have an average cross-sectional thickness in a range from about 1 to about 2 nanometers.

12. The solar cell structure of claim 10 wherein said binder component comprises at least one of a metal oxide, a metal nitride, a semiconductor oxide, a semiconductor nitride, a polymer and a silicone.

13. The solar cell structure of claim 10 wherein said binder component is selected from the group consisting of alumina, titania, hafnia, silica, silicon nitride, zinc oxide, indium tin oxide and combinations thereof.

14. The solar cell structure of claim 10 wherein said bonding layer has a thickness in a range from about 10 nanometers to about 100 nanometers.

15. The solar cell structure of claim 10 wherein said bonding layer has an optical transmission of at least 95 percent at a wavelength of at least 800 nanometers.

16. The solar cell structure of claim 10 wherein said bonding layer has a total electrical resistance of at most 1 Ohm-cm$^2$.

17. The solar cell structure of claim 10 wherein the at least one top subcell includes one or more layers of semiconductor material and has a front surface.

18. The solar cell structure of claim 17 wherein an anti-reflective coating layer is positioned adjacent to the front surface of the at least one top subcell.

19. The solar cell structure of claim 17 wherein one or more contacts are positioned adjacent to the front surface of the at least one top subcell.

20. The semiconductor structure of claim 1 wherein said first semiconductor wafer including a top substrate and said at least at least one top subcell has been epitaxially grown from said top substrate.

* * * * *